(12) United States Patent
Chen et al.

(10) Patent No.: US 8,846,296 B2
(45) Date of Patent: Sep. 30, 2014

(54) PHOTORESIST COMPOSITIONS

(75) Inventors: Kuang-Jung Chen, Poughkeepsie, NY (US); Wu-Song Huang, Poughkeepsie, NY (US); Ranee Wai-Ling Kwong, Wappingers Falls, NY (US); Sen Liu, Highland Park, NJ (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/461,960

(22) Filed: May 2, 2012

(65) Prior Publication Data

US 2012/0214099 A1    Aug. 23, 2012

Related U.S. Application Data

(63) Continuation of application No. 11/970,761, filed on Jan. 8, 2008, now Pat. No. 8,236,476.

(51) Int. Cl.
  *G03F 7/004*   (2006.01)
  *G03F 7/028*   (2006.01)

(52) U.S. Cl.
  USPC ........ 430/270.1; 430/919; 430/920; 430/921; 430/925

(58) Field of Classification Search
  USPC .............. 430/270.1, 919, 920, 921, 923, 924, 430/925
  See application file for complete search history.

(56) References Cited

U.S. PATENT DOCUMENTS

| | | | |
|---|---|---|---|
| 5,576,143 A | 11/1996 | Aoai et al. | |
| 5,650,261 A | 7/1997 | Winkle | |
| 5,837,426 A | 11/1998 | Tseng et al. | |
| 6,219,786 B1 | 4/2001 | Cunningham et al. | |
| 6,319,649 B1 * | 11/2001 | Kato et al. | 430/176 |
| 6,338,934 B1 | 1/2002 | Chen et al. | |
| 6,395,451 B1 | 5/2002 | Jung et al. | |
| 6,645,693 B2 | 11/2003 | Hashimoto et al. | |
| 6,692,897 B2 | 2/2004 | Fujimori et al. | |
| 6,794,110 B2 * | 9/2004 | Breyta et al. | 430/270.1 |
| 6,800,414 B2 | 10/2004 | Nishimura et al. | |
| 6,969,577 B2 | 11/2005 | Adegawa | |
| 7,157,208 B2 * | 1/2007 | Sasaki et al. | 430/270.1 |
| 7,838,198 B2 | 11/2010 | Chen et al. | |
| 7,838,200 B2 | 11/2010 | Chen et al. | |
| 8,236,476 B2 * | 8/2012 | Chen et al. | 430/270.1 |
| 8,383,316 B2 | 2/2013 | Cooper et al. | |
| 8,568,960 B2 | 10/2013 | Chen et al. | |
| 2002/0110762 A1 | 8/2002 | Lin | |
| 2002/0160317 A1 | 10/2002 | Richter et al. | |
| 2004/0081909 A1 * | 4/2004 | Ohnishi et al. | 430/189 |
| 2004/0133640 A1 | 7/2004 | Yeager et al. | |
| 2005/0271981 A1 | 12/2005 | Oohashi et al. | |
| 2006/0065122 A1 | 3/2006 | Song et al. | |
| 2006/0125847 A1 | 6/2006 | Andreev et al. | |
| 2007/0014233 A1 | 1/2007 | Oguro et al. | |
| 2007/0205528 A1 | 9/2007 | Patel et al. | |
| 2008/0038662 A1 * | 2/2008 | Hatakeyama et al. | 430/270.1 |
| 2008/0148378 A1 | 6/2008 | Wing et al. | |
| 2008/0153030 A1 * | 6/2008 | Kobayashi et al. | 430/270.1 |
| 2009/0155718 A1 | 6/2009 | Chen et al. | |
| 2009/0176174 A1 | 7/2009 | Chen et al. | |
| 2010/0174731 A1 | 7/2010 | Vermeulen et al. | |
| 2012/0178027 A1 | 7/2012 | Chen et al. | |
| 2012/0280061 A1 | 11/2012 | Pelagatti et al. | |
| 2013/0246606 A1 | 9/2013 | Branch et al. | |

FOREIGN PATENT DOCUMENTS

| | | |
|---|---|---|
| EP | 0425142 | 5/1991 |
| EP | 0425142 A2 | 5/1991 |
| JP | 10 83079 | 3/1998 |
| JP | 10083079 | 3/1998 |
| JP | 2000 10270 | 1/2000 |
| JP | 2000010270 | 1/2000 |
| JP | 2000 330270 | 11/2000 |
| JP | 2000330270 | 11/2000 |
| JP | 2002128750 | 5/2002 |
| JP | 200477553 | 3/2004 |
| JP | 2004099579 | 4/2004 |
| JP | 2002265531 | 9/2009 |
| WO | 0234714 | 5/2002 |
| WO | 2006 095670 A1 | 9/2006 |
| WO | 2006095670 | 9/2006 |

OTHER PUBLICATIONS

Machine translation of JP2004077553, published on Mar. 11, 2004.
Machine translation of JP10083079, published on Mar. 31, 1998.
Arimitsu, et al.; Non-linear organic reaction of 9-fluorenylmethyl carbamates as base amplifiers to proliferate alphatic amines and their application to a novel photopolymer system, Journal of Materials Chemistry, 2004, 14, 336-343.
Arimitsu et al.; Synthesis of 9-Fluorenylmethyl Carbamates as a Base Amplifier and Their Applications to Photopolymer Systems, Journal of Photopolymer Science and Technology, vol. 12, No. 2, (1999), pp. 317-318.
Lee et al.; Photolithographic Micropatterning of an Electroluminescent Polymer Using Photobase Generator; Macromolecules 2003, vol. 36, No. 24; pp. 9252.
Glodde et al.; Measurements of Acid Generation by EUV Irradiation in Lithographic Films, Published in J. Vac. Sci. Technol. B., pp. 2496-2503, Nov. 25, 2007, 13 pages.

(Continued)

*Primary Examiner* — Anca Eoff
(74) *Attorney, Agent, or Firm* — Schmeiser, Olsen & Watts, LLP; Yuanmin Cai

(57) ABSTRACT

A composition is provided. The composition includes a polymer and a photosensitive acid generator capable of generating a first amount of acid upon exposure to a first dose of radiation and a second amount of acid upon exposure to a second dose of radiation. The second amount of acid is greater than the first amount of acid. The second dose is greater than the first dose. The composition includes a photosensitive base generator capable of generating a first amount of base upon exposure to the first dose and a second amount of base upon exposure to the second dose, where the first amount of base is greater than the first amount of acid and the second amount of base is less than the second amount of acid. The photosensitive base generator may include benzoin carbamates, O-carbamoylhydroxylamines, O-carbamoyloximes, aromatic sulfonamides, α-lactones, N-(2-Arylethenyl)amides, azides, amides, oximines, quaternary ammonium salts, or amineimides.

15 Claims, 5 Drawing Sheets

(56) References Cited

OTHER PUBLICATIONS

Office Action (Mail Date Jan. 11, 2011) for U.S. Appl. No. 11/970,761; Filing Date Jan. 8, 2008; Confirmation No. 3670.
Amendment filed Apr. 5, 2011 in response to Office Action (Mail Date Jan. 11, 2011) for U.S. Appl. No. 11/970,761; Filing Date Jan. 8, 2008; Confirmation No. 3670.
Final Office Action (Mail Date Jun. 13, 2011) for U.S. Appl. No. 11/970,761; Filing Date Jan. 8, 2008; Confirmation No. 3670.
Request for Continued Examination and Amendment filed Sep. 12, 2011 in response to Final Office Action (Mail Date Jun. 13, 2011) for U.S. Appl. No. 11/970,761; Filing Date Jan. 8, 2008; Confirmation No. 3670.
Office Action (Mail Date Oct. 28, 2011) for U.S. Appl. No. 11/970,761; Filing Date Jan. 8, 2008; Confirmation No. 3670.
Amendment filed Jan. 27, 2012 in response to Office Action (Mail Date Oct. 28, 2011) for U.S. Appl. No. 11/970,761; Filing Date Jan. 8, 2008; Confirmation No. 3670.
Final Office Action (Mail Date Mar. 1, 2012) for U.S. Appl. No. 11/970,761; Filing Date Jan. 8, 2008; Confirmation No. 3670.
U.S. Appl. No. 13/418,42, filed Mar. 13, 2012; Confirmation No. 8331.
Final Response (Apr. 25, 2012) for U.S. Appl. No. 11/970,761; Filing Date Jan. 8, 2008; Confirmation No. 3670.
Notice of Allowance (May 15, 2012) for U.S. Appl. No. 11/970,761; Filing Date Jan. 8, 2008; Confirmation No. 3670.
312 Amendment (Jun. 22, 2012) for U.S. Appl. No. 11/970,761; Filing Date Jan. 8, 2008; Confirmation No. 3670.
Office Action (Mar. 21, 2013) for U.S. Appl. No. 13/418,761; Filing Date Mar. 12, 2012; Confirmation No. 6218, First Named Inventor Joel W. Branch.
Amendment (Jun. 10, 2013) for U.S. Appl. No. 13/518,761; Filing Date Jul. 20, 2012; Confirmation No. 7732, First Named Inventor Stefano Pelagatti.
Notice of Allowance (Jun. 21, 2013) for U.S. Appl. No. 13/518,761; Filing Date Jul. 20, 2012; Confirmation No. 7732, First Named Inventor Stefano Pelagatti.
Application No. 08 869 857.6 Foreign Examination Report dated Jul. 2, 2014.

\* cited by examiner

PHOTORESIST COMPOSITIONS

This application is a continuation application claiming priority to Ser. No. 11/970,761, filed Jan. 8, 2008, now U.S. Pat. No. 8,236,476, issued Aug. 7, 2012.

FIELD OF THE INVENTION

The invention relates to photoresist compositions and methods for photolithography using the same.

BACKGROUND OF THE INVENTION

Optical photolithography has been the major technique for the semiconductor industry. Many resolution enhancement technology (RET) methods have also contributed to the extension of optical photolithography to print very low k1 images. The value of $k_1$ can be found using the optical projection lithography resolution equation $W = k_1 \lambda/NA$, where W is the minimum printable feature size, $\lambda$ is the exposure wavelength (e.g. 193 nm, 157 nm), NA is the numerical aperture of the lithography system and $k_1$ is a lithographic constant of the system. Double exposure (DE) has emerged as a method to reduce $k_1$ in the fabrication of integrated circuit chips. Several double exposure schemes have been developed including double dipole lithography (DDL) and double exposure double etch ($DE^2$). However, DDL can only print images within diffraction limit, while $DE^2$ is a complex and expensive process. Accordingly, there exists a need to overcome the deficiencies and limitations described hereinabove.

SUMMARY OF THE INVENTION

The present invention relates to a photoresist composition, comprising:
  a polymer having a structure comprising at least one acid labile group or at least one base soluble group;
  a photosensitive acid generator capable of generating a first amount of acid upon exposure to a first dose of radiation, said photosensitive acid generator capable of generating a second amount of acid upon exposure to a second dose of radiation, said second amount of acid greater than said first amount of acid, said second dose of radiation greater than said first dose of radiation; and
  a photosensitive base generator capable of generating a first amount of base upon exposure to said first dose of radiation, said photosensitive base generator capable of generating a second amount of base upon exposure to said second dose of radiation, said first amount of base greater than said first amount of acid, said second amount of base less than said second amount of acid.

The present invention relates to a method comprising:
  forming a film of a photoresist on a substrate, said photoresist comprising a polymer having a structure comprising at least one acid labile group or at least one base soluble group, a photosensitive acid generator, and a photosensitive base generator, said photosensitive acid generator capable of generating a first amount of acid upon exposure to a first dose of radiation, said photosensitive acid generator capable of generating a second amount of acid upon exposure to a second dose of radiation, said second amount of acid greater than said first amount of acid, said second dose of radiation greater than said first dose of radiation, said photosensitive base generator capable of generating a first amount of base upon exposure to said first dose of radiation, said photosensitive base generator capable of generating a second amount of base upon exposure to said second dose of radiation, said first amount of base greater than said first amount of acid, said second amount of base less than said second amount of acid;
  exposing a first region of said film to radiation through a first mask having a first image pattern; and
  exposing a second region of said film to radiation through a second mask having a second image pattern.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
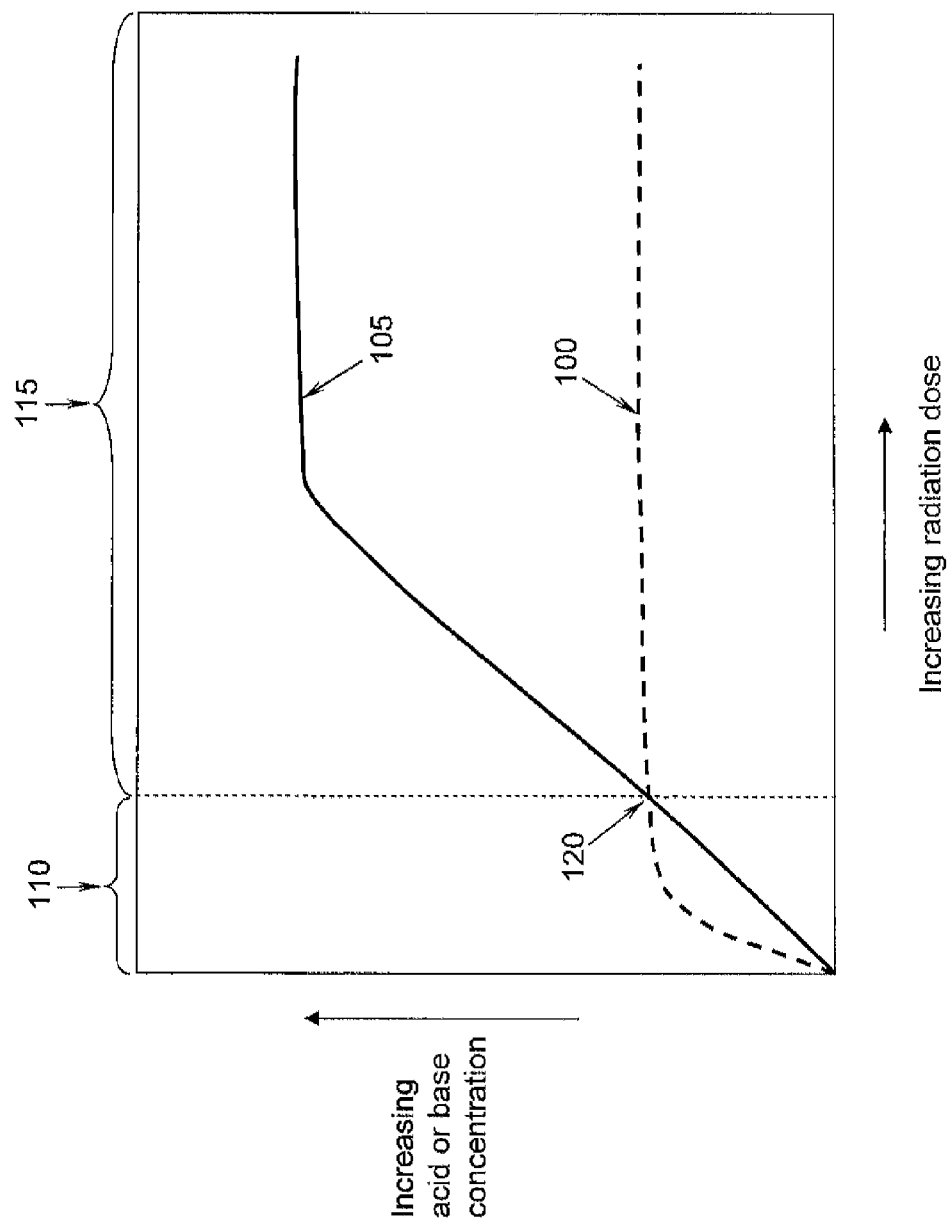
FIG. 1 is an illustration of a graph depicting an example of a photoefficiency curve, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

The photoresist composition described herein may comprise a polymer, a photosensitive acid generator, and a photosensitive base generator. The polymer of the photoresist described herein may comprise any polymer suitable for chemically amplified photoresists. The polymer may have a structure comprising at least one acid labile group or at least one base soluble group. For example, a polymer in a positive tone chemically amplified system may comprise at least one repeating unit having at least one acid labile group which can be deprotected in an acid-catalyzed thermal baking process making the polymer substantially soluble in base developers. In another example, a polymer in a negative tone chemically amplified system may comprise at least one repeating unit having at least one base soluble group which may allow the polymer to be substantially soluble in base developers. The polymer may be configured to crosslink or undergo a polarity change in an acid-catalyzed thermal baking process, thus making the polymer substantially insoluble in base developers. The polymer of the photoresist may comprise a homopolymer, a copolymer, a terpolymer, a tetrapolymer, etc. The polymer may comprise a polymer blend of two or more polymers, such as blends of two or more of the polymers described above. In some embodiments, the polymer structure may comprise repeating units such as:

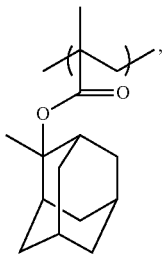
(MAdMA)

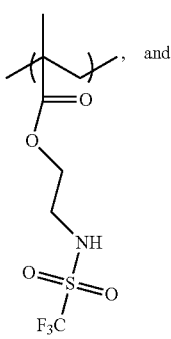
, and
(NLM)

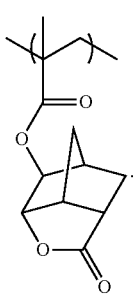
.

The photoresist composition may comprise a photosensitive base generator (PBG). A photosensitive base generator is a compound which produces a base upon exposure to a dose of electromagnetic radiation, such as visible, ultraviolet (UV) and extreme ultraviolet (EUV), for example. Some suitable photosensitive base generators may produce an amine base upon exposure to radiation.

Some examples of suitable photosensitive base generators include: benzyl carbamates of the structure

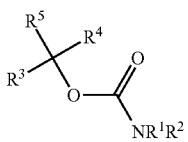

where $R^1$=H or alkyl group, $R^2$=alkyl, substituted alkyl, aryl or substituted aryl group, $R^3$, $R^4$=H, alkyl, substituted alkyl, aryl or substituted aryl group, and $R^5$=aryl group, $R^1$ and $R^2$ may link to form a cyclic structure, such as 2-nitrobenzyl carbamates where $R^5$ is a 2-nitrophenyl group and $R^3$, $R^4$=H;

Carbamates of the structure

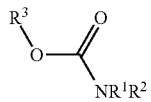

where $R^1$=H or alkyl group, $R^2$=alkyl, substituted alkyl, aryl or substituted aryl group, $R^1$ and $R^2$ may link to form a cyclic structure, and $R^3$=alkyl, substituted alkyl, aryl or substituted aryl group;

Benzoin carbamates (2-oxo-1,2-diphenylthyl carbamates) of the structure

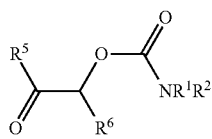

where $R^1$=H or alkyl group, $R^2$=alkyl, substituted alkyl, aryl or substituted aryl group, $R^1$ and $R^2$ may link to form a cyclic structure, and $R^5$ and $R^6$ may each independently be an aryl or a substituted aryl group, such as benzoin carbamates where $R^1$=H, $R^2$=$C_6$ to $C_{10}$ alkyl group, and $R^5$ and $R^6$ are each phenyl groups;

O-carbamoylhydroxylamines of the structure

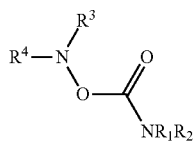

where $R^1$=H or alkyl group; $R^2$=alkyl, substituted alkyl, aryl or substituted aryl group, $R^1$ and $R^2$ may link to form a cyclic structure, and $R^3$, $R^4$=H, alkyl, substituted alkyl, aryl, substituted aryl, or acyl group, such as O-carbamolhydroxphthalamides where $R^1$=H, $R^2$=$C_6$ to $C_{10}$ alkyl group, and $R^3$ and $R^4$ are each a 2-carboxybenzoyl group;

O-Carbamoyloximes of the structure

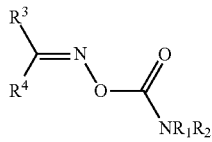

where $R^1$=H or alkyl group, $R^2$=alkyl or aryl group, and $R^3$, $R^4$=H, alkyl, substituted alkyl, aryl, or substituted aryl group;

Aromatic sulfonamides of the structure

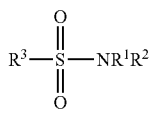

where $R^1$=H or alkyl group, $R^2$=alkyl, substituted alkyl, aryl or substituted aryl group, $R^1$ and $R^2$ may link to form a cyclic structure, and $R^3$=aryl group or substituted aryl groups;

α-Lactones of the structure

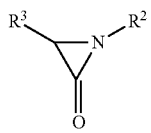

where $R^2$=alkyl, aryl group, $R^3$=alkyl, substituted alkyl, aryl, or substituted aryl group;

N-(2-Arylethenyl)amides of the structure

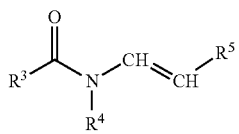

where $R^3$=alkyl, substituted alkyl, aryl, or substituted aryl group, $R^4$=alkyl or substituted alkyl group, and $R^5$=aryl group;

Azides of the structure $R^6N_3$ where $R^6$=aryl or substituted aryl group;

Amides of the structure

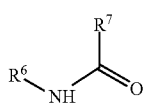

where $R^6$=aryl or substituted aryl group, $R^7$=H, alkyl, substituted alkyl, aryl or substituted aryl group;

Oximines of the structure

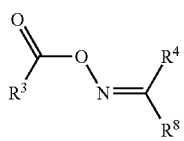

where $R^3$, $R^4$, $R^8$=alkyl, substituted alkyl, aryl or substituted aryl group;

Quaternary ammonium salts of the structure

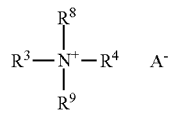

where $R^3$, $R^4$, $R^8$, $R^9$=alkyl, substituted alkyl, aryl or substituted aryl group, $A^-$=an anion such as a halide ion (such as $Cl^-$, $BR^-$, $I^-$, $F^-$, etc.) or sulfonate ion; and Amineimides of the structure

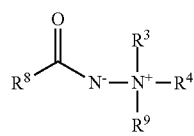

Where each of $R^3$, $R^4$, $R^8$ and $R^9$ is an alkyl, substituted alkyl, aryl or substituted aryl group, In all the above structural formulas: $R^1$ is H, an alkyl group or a substituted alkyl group; and $R^2$ is an alkyl group, substituted alkyl group, an aromatic group, or an substituted aromatic group. The PBG described above may also be linked to form dimers, where such a linkage may prevent volatility of the base produced.

Polymeric materials incorporating the compounds described above may also be useful as photosensitive base generators. Polyurethanes are examples of such polymers.

Other examples of suitable photosensitive base generators within the scope of the photoresist composition described herein include carbamates, such as:

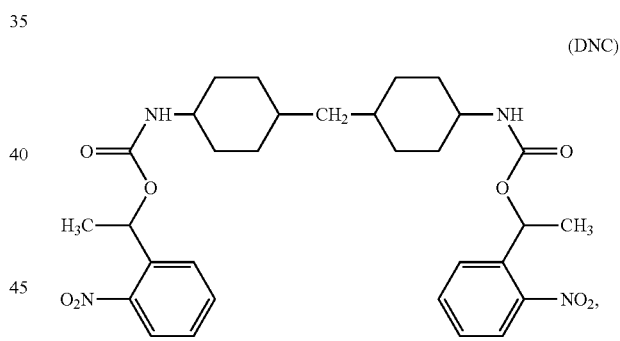
(DNC)

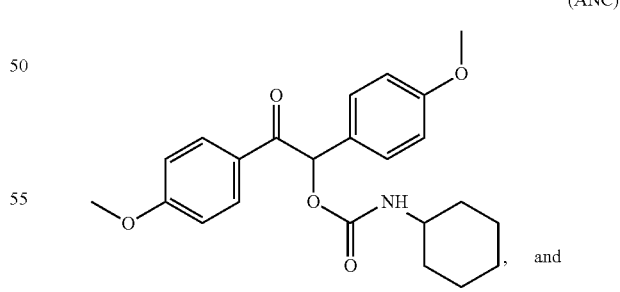
(ANC)

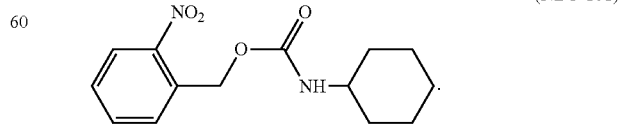
(NBC-101)

The photoresist may comprise a photosensitive acid generator (PAG), capable of releasing or generating an amount of acid (such as 1 mole of acid per mole of PAG, for example) upon exposure to a dose of electromagnetic radiation, such as visible, ultraviolet (UV) and extreme ultraviolet (EUV), for example. The PAG may comprise, for example, triphenyl sulfonium nonaflate (TPSN), (trifluoro-methylsulfonyloxy)-bicyclo[2.2.1]hept-5-ene-2,3-dicarboximide (MDT), N-hydroxy-naphthalimide dodecane sulfonate (DDSN), onium salts, aromatic diazonium salts, sulfonium salts, diaryliodonium salts, sulfonic acid esters of N-hydroxyamides, imides, or combinations thereof.

Photosensitive acid generators and photosensitive base generators as used herein may each be described as having a photoefficiency, where photoefficiency may be described as the amount of acid or base, respectively, produced per dose of radiation at a particular wavelength or over a range of wavelengths. Compounds having low photoefficiencies require higher doses of radiation to produce the same amount of acid or base as compounds having higher photoefficiencies.

A photoefficiency may be determined for a particular PAG or PBG by titrating the acid or base produced in a resist composition after exposure to a particular dose of radiation. A series of titrations at different concentrations of PAG or PBG through a range of exposure doses may be used to produce a photoefficiency curve representing acid or base production as a function of radiation dose. The radiation dose range may be from 0 millijoules/(centimeter)$^2$ (mj/cm$^2$) to about 100 mj/cm$^2$, for example. Titrations may be performed using methods known in the art such as with indicators and an appropriate base or acid, where indicator concentrations may be determined using known methods such as UV-vis spectroscopy, for example. For example, a known amount of PAG or PBG may be incorporated into a photoresist formulation having an amount of an appropriate indicator (i.e. a specific indicator for an acid or base). The decrease in the concentration of indicator may then be determined for each dose of radiation to which a sample (such as a film) of the photoresist is exposed, where the decrease in indicator concentration is equal to the increase in acid or base produced by the PAG or PBG, respectively. In some embodiments, the same indicator may be used for both acid titration and base titration. For example, for an acid indicator, the concentration of the indicator decreases with an increase in the radiation dose exposed to the PAG. The same indicator may be used for determining base generation by a PBG, by first reacting the indicator with a known quantity of acid, followed by exposure to a radiation dose. In this case, the concentration of the indicator increases with the increase in radiation dose exposed to the PBG.

In embodiments of the photoresist described herein comprising a polymer, a PBG, and a PAG, the PBG may have a higher photoefficiency than the PAG. Thus at low radiation doses, the PBG may produce base in higher concentration than the acid produced by an equivalent amount of the PAG at the same radiation dose. The higher concentration of base produced than acid equates to a higher amount of PBG consumed (to produce the base) than the amount of PAG consumed (to produce the acid). At sufficiently high radiation doses, the PAG may produce the same concentration of acid as the concentration of base produced by the PBG at the same higher dose, such as a dose where PBG and PAG are essentially completely consumed.

In some embodiments of the photoresists herein, the concentration of PAG in the resist may be higher that the concentration of PBG in the resist. For such a resist composition, the ratio of the concentrations of PAG to PBG may be such that at low radiation doses, the concentration of base produced by the PBG may be greater that the concentration of acid produced by the PAG, whereas for higher doses of radiation, the concentration of acid produced by the PAG may be greater than the concentration of base produced by the PBG.

FIG. 1 is an illustration of a graph depicting an example of a photoefficiency curve for a PBG 100 and a theoretical photoefficiency curve for a PAG 105, where acid and base concentration are plotted as a function of radiation dose. In this example, the concentration of PAG is higher than the concentration of PBG in the resist. In a range of low radiation dose 110, the curve for the PBG 100 is higher than the curve for the PAG 105 indicating the photoefficiency of the PBG is sufficiently high to produce sufficient base to neutralize all of the acid produced by the PAG. Whereas in a range of high radiation dose 115, the PAG curve 105 is higher than the curve for the PBG 110, indicating that the PAG produces a higher concentration of acid than the concentration of base produced by the PBG. The ratio of concentrations of the PAG and the PBG may be varied to provide a desired amount of excess base in the low dose range and excess acid in the high dose range. For example, a smaller ratio of PAG to PBG may reduce the amount of excess acid in the high dose range, and may increase the amount of excess base in the low dose range. Likewise, adjusting the relative amounts of PAG and PBG in a photoresist formulation may allow for making changes in the amount of base and acid produced in regions receiving high doses of radiation and low dose of radiation.

The compositions and relative concentrations of PBG and PAG may each be selected based on photoefficiency curves of each such that a "crossover point" is present such as point 120 in FIG. 1, above which the concentration of acid produced exceeds the concentration of base produced, and below which the concentration of base produced exceeds the concentration of acid produced. For example, the PAG may be selected such that the PAG is capable of generating a first amount of acid upon exposure to a first dose of radiation, and capable of generating a second amount of acid upon exposure to a second dose of radiation, where the second amount of acid is greater than the first amount of acid, and the second dose of radiation is greater than first dose of radiation. Likewise, the PBG may be selected such that the PBG is capable of generating a first amount of base upon exposure to the same first dose of radiation as the PAG, and capable of generating a second amount of base upon exposure to the same second dose of radiation as the PAG, where the first amount of base is greater than the first amount of acid, and the second amount of base is less than the second amount of acid.

A film of the photoresist described above regarding FIG. 1, when exposed to radiation (such as being patternwise imaged though a mask), where some regions of the film are exposed to radiation and other regions of the film are unexposed, some regions may be exposed to low doses of radiation such as regions near or between boundaries of exposed regions and unexposed regions. Some low dose regions and high dose regions may thus be adjacent and contiguous with each other, where the high and low dose regions may be connected in a continuous mode. The terms high dose and low dose indicate the regions exposed to high and low relative radiation dose ranges, respectively, such as described for high and low dose ranges 115 and 110, respectively, of FIG. 1. The dose distribution may be determined by the aerial images projected on the resist film. For example, in high contrast images, the low dose regions are narrow. Conversely, for low contrast images, the low dose regions are broad. Low radiation doses in boundary regions are caused by phenomena such as diffraction of the radiation (such as electromagnetic radiation) passing through transparent narrow openings (unmasked areas) in the mask. In regions of the film exposed to low doses of radiation (low dose regions), the base produced by the PBG may be in sufficient excess to neutralize essentially all of the acid produced by the PAG in the low dose region and allow for some of the produced base to remain in the low dose region. Likewise, in regions of the photoresist film exposed to higher doses of radiation (high dose region), such as in exposed areas not near boundaries, the acid produced by the PAG may be in sufficient excess to neutralize essentially all of the base produced by the PBG in the high dose region and to allow for some of the produced acid to remain in the high dose region, where the acid may react with the polymer of the composition. Thus in the low dose exposed regions of the photoresist, acid produced as a result of radiation exposure is neutralized and is prevented from affecting the resist formulation, such as reacting with the polymer of the resist. Likewise, in high dose exposed regions of the photoresist, base produced by the PBG as a result of radiation exposure is neutralized by the acid produced by the PAG, where the acid may be in sufficient excess to affect the resist formulation, such as by reaction with the polymer to make it substantially soluble or substantially insoluble in a developer depending upon the polymer composition.

The photoresist may further comprise a base proliferator, where a base proliferator is a compound capable of producing an amount of base through catalytic reaction with another base. For example, the base proliferator may be capable of releasing base through a base-catalyzed decomposition mechanism, thus the base proliferator may initiate a cascade of reactions to form a large amount of base. The base proliferation process may be triggered by heat in combination with a catalytic amount of base. The presence of a base proliferator may amplify the effects of the PBG when exposed to radiation such as when patternwise imaging a resist film as described above. Thus base concentrations remaining in low dose regions of the resist after exposure to radiation may be amplified or increased by reaction with a base proliferator present in the resist formulation in the low dose region.

Some examples of base proliferators include fluorenylmethyl carbamates, phenylsulfonylethyl carbamates, and 3-nitropentane-2-yl carbamates, such as:

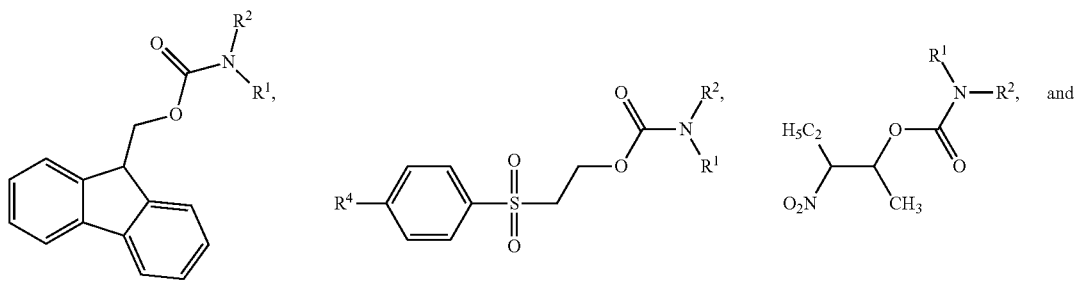

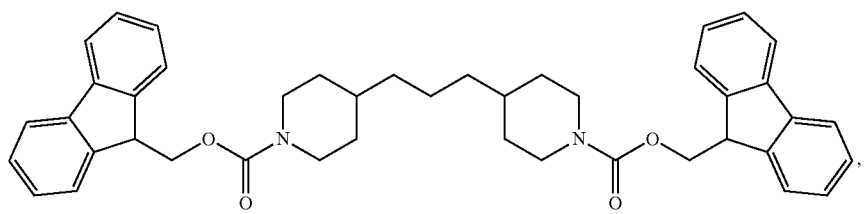

(DFC)

wherein each $R^1$ or $R^2$ is independently selected from the group consisting of a hydrogen atom, a linear alkyl, a branched alkyl, a cycloalkyl, a halogenated linear alkyl, a halogenated branched alkyl, a halogenated cycloalkyl, an aryl, a halogenated aryl, and combinations thereof, and wherein $R^4$ may be hydrogen or alkyl. Halogenated may comprise fluorinated, chlorinated, or brominated. For example, each $R^1$ or $R^2$ may be independently selected from the group consisting of a fluorinated linear alkyl, a fluorinated branched alkyl, a fluorinated cycloalkyl, an aryl, a fluorinated aryl, and combinations thereof, wherein $R^3$ is selected from the group consisting of a fluorinated linear alkyl, a fluorinated branched alkyl, a fluorinated cycloalkyl, an aryl, a fluorinated aryl, and combinations thereof.

The base proliferators described above may also be linked to form dimer structures, where such linking may prevent volatility of the base produced. Some examples of dimer forms of base proliferators include:

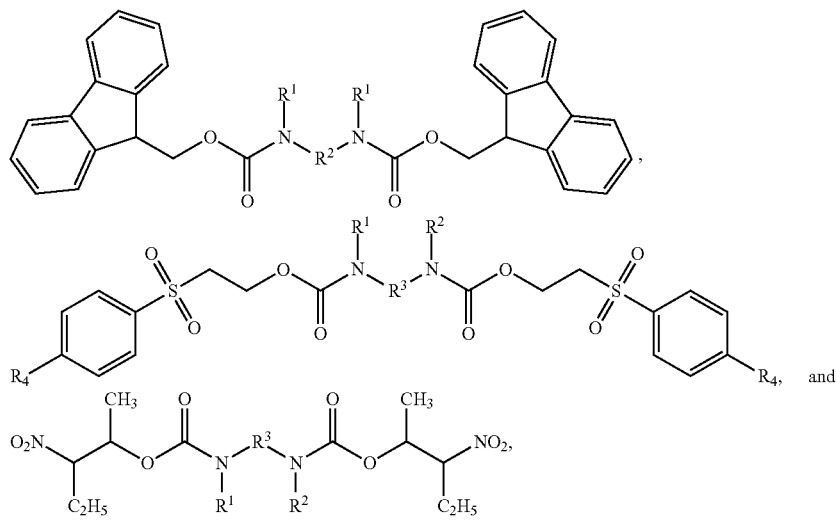

wherein each $R^1$ or $R^2$ is independently selected from the group consisting of a hydrogen atom, a linear alkyl, a branched alkyl, a cycloalkyl, a halogenated linear alkyl, a halogenated branched alkyl, a halogenated cycloalkyl, an aryl, a halogenated aryl, and combinations thereof, wherein $R^3$ is selected from the group consisting of a linear alkyl, a branched alkyl, a cycloalkyl, a halogenated linear alkyl, a halogenated branched alkyl, a halogenated cycloalkyl, an aryl, a halogenated aryl, and combinations thereof, and wherein $R^4$ may be hydrogen or alkyl. As above, halogenated may comprise fluorinated, chlorinated, or brominated. For example, each $R^1$ or $R^2$ may be independently selected from the group consisting of a fluorinated linear alkyl, a fluorinated branched alkyl, a fluorinated cycloalkyl, an aryl, a fluorinated aryl, and combinations thereof, wherein $R^3$ is selected from the group consisting of a fluorinated linear alkyl, a fluorinated branched alkyl, a fluorinated cycloalkyl, an aryl, a fluorinated aryl, and combinations thereof.

The photoresist may further comprise a surfactant. Surfactants may be used to improve coating uniformity, and may include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Union Carbide Corporation in Danbury, Conn.

The photoresist may include a casting solvent to dissolve the other components, so that the photoresist may be applied evenly on the substrate surface to provide a defect-free coating. Where the photoresist is used in a multilayer imaging process, the solvent used in the imaging layer may not be a solvent to the underlayer materials, otherwise unwanted intermixing may occur. Some examples of suitable casting solvents include ethers, glycol ethers, aromatic hydrocarbons, ketones, esters, ethyl lactate, gamma-butyrolactone (GBL), cyclohexanone, ethoxyethylpropionate (EEP), a combination of EEP and GBL, and propylene glycol methyl ether acetate (PGMEA). The present invention is not limited to the selection of any particular solvent.

The photoresist may include a base quencher, sensitizers or other expedients known in the art. The compositions of the photoresists described herein are not limited to any specific selection of these expedients, where base quenchers may comprise aliphatic amines, aromatic amines, carboxylates, hydroxides, or combinations thereof. For example base quenchers may include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines such as in the PLURONIC or TETRONIC series commercially available from BASF. Tetra alkyl ammonium hydroxides or cetyltrimethyl ammonium hydroxide may be used as a base quencher when the PAG is an onium salt. For photoresist embodiments comprising a base proliferator, quenchers may comprise weak base quenchers or those quenchers having amine groups protected with acid labile groups, such as t-butyl groups.

The photoresist composition is not limited to any specific proportions of the various components. The photoresist composition may comprise about 1% by weight (wt %) to about 30 wt % of polymer based on the total weight of the composition, such as from about 2 wt % to about 15 wt %. The photoresist composition may comprise from about 0.1 wt % to about 30 wt % photosensitive base generator based on the weight of the polymer in the composition, such as from about 0.1 wt % to about 20 wt %. The photoresist composition may comprise from about 0.5 wt % to about 30 wt % photosensitive acid generator based on the weight of the polymer in the composition, such as from about 0.5 wt % to about 20 wt %.

The photoresist composition may comprise from about 0.1 wt % to about 30 wt % base proliferator based on the weight of the polymer in the composition, such as from about 0.1 wt % to about 20 wt %. The photoresist composition may comprise from about 70 wt % to about 99 wt. % solvent based on the total weight of the composition, such as from about 85 wt % to about 98 wt %. The photoresist composition may further include about 0.1 wt % to about 1.0 wt % of base quencher based on the total weight of the polymer in the composition. The photoresist composition may further include about 0.001 wt % to about 0.1 wt % of surfactant based on the total weight of polymer in the composition.

The term substantially insoluble, as used herein, is intended to comprise having such a small degree of solubility so as to not effect the quality of an image formed from a photoresist by loss of material (e.g. polymer, photoresist, etc.) through dissolution into aqueous base solution or photoresist solvents from regions of the photoresist layer not containing photosensitive acid generator derived acid. The term substantially soluble, as used herein, is intended to comprise having a high enough degree of solubility in aqueous base solutions or solvents so to allow all or almost all (i.e., any remaining material is present such a small amounts so as to not interfere with subsequent processing steps) of the material (e.g. polymer, photoresist, etc.) in regions containing acid derived from the photosensitive acid generator to dissolve into aqueous base solutions or photoresist solvents. In the context of photoresist formulation and semiconductor processing the term substantially insoluble is intended to include polymers completely or almost completely insoluble in photoresist solvents. In the context of photoresist formulation and semiconductor processing the term substantially soluble is intended to include polymers completely or almost completely soluble in photoresist solvents. In general, the polymer dissolution rates affect the dissolution rates of the photoresist layers most strongly, thus a substantially insoluble polymer may render substantially insoluble a photoresist comprising that polymer. Substantially insoluble photoresists have a dissolution rate of less than about 0.2 nanometers/second (nm/s) in solvent or aqueous base, while substantially soluble photoresists have a dissolution rate of greater than about 5 nm/s in solvent or aqueous base. Photosensitive acid generators, quencher and other additives may also alter the dissolution rates of the final photoresist layer.

Figure 2:
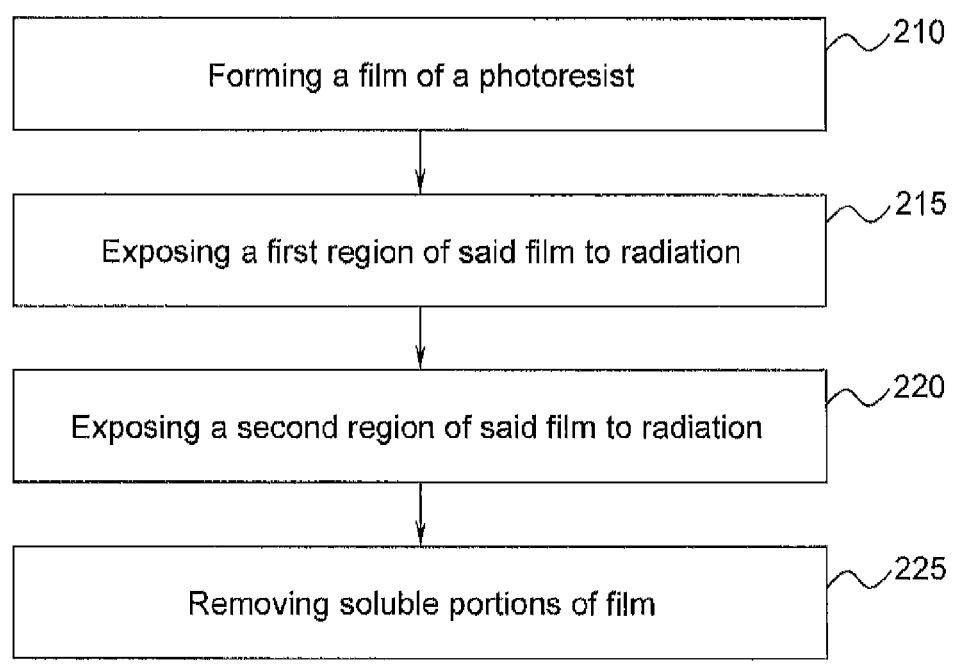
FIG. 2 is an illustration of a flow chart of an example of a method for forming a patterned layer, in accordance with embodiments of the present invention.

FIG. 2 is an illustration of a flow chart of an example of a method for forming a patterned layer. Step 210 comprises forming a film of a photoresist on a substrate, where the photoresist composition may comprise a polymer, a PAG, and a PBG, such as described above. In the photoresist composition, the concentration of the PAG may be higher than the concentration of the PBG. The polymer may have a structure comprising at least one acid labile group or at least one base soluble group. The PAG may be capable of generating a first amount of acid upon exposure to a first dose of radiation, and capable of generating a second amount of acid upon exposure to a second dose of radiation, where the second amount of acid is greater than the first amount of acid, and the second dose of radiation is greater than said first dose of radiation. The PBG generator may be capable of generating a first amount of base upon exposure to the same first dose of radiation (for example, the same magnitude and wavelength of radiation), and capable of generating a second amount of base upon exposure to the same second dose of radiation, where the first amount of base is greater than the first amount of acid (i.e. base is in excess of acid), and the second amount of base is less than the second amount of acid (i.e. the acid is in excess of base). An example of this is described above where photoefficiency curves of the acid and base have a crossover point as illustrated in FIG. 1.

The film may be formed by a process such as spin coating, spray coating, dip coating, doctor-blading, roll coating, and the like, which may be used individually or in one or more combination thereof in accordance with the methods of the present invention. The substrate may comprise materials of one or more of the IUPAC Groups 4, 6, 11, 12, 13, 14, and 15 elements, plastic material, silicon dioxide, glass, fused silica, mica, ceramic, metals deposited on the aforementioned substrates, combinations thereof, and the like. The substrate may comprise a stack or layering of different materials. For a substrate used in a trilayer approach, there may be a comparatively thick organic underlayer and a thin Si containing interlayer, where the Si containing layer may either be a chemical vapor deposited silicon oxide layer or a spin coated silsesquioxane polymer film. For example, a substrate may comprise a prepared silicon wafer substrate such as those employed in semiconductor manufacturing. The films and layers described herein may be disposed on top of the substrate or may be integrally joined with the substrate.

Step 215 comprises exposing a first region of the film to radiation having a first exposure dose, resulting in the photosensitive acid generator generating a first acid catalyst in the exposed first region of the film and the photosensitive base generator generating a first base in the exposed first region of the film, where the exposed first region comprises a first low dose region and a first high dose region.

A high dose region, as described herein, comprises a portion of an exposed region receiving radiation of sufficiently high dosage such that the amount of acid generated by the PAG is greater than the amount of base generated by the PBG, such as the high radiation dose range 115 in FIG. 1. A low dose region, as described herein, comprises a portion of an exposed region receiving radiation of sufficiently low dosage such that the amount of base generated by the PBG is greater than the amount of acid generated by the PAG, such as the low radiation dose range 110 in FIG. 1. For example, in a first portion of the exposed region the concentration of the acid catalyst is higher than the concentration of the base (such as in high dose regions), and in a second portion of the exposed region the concentration of the acid catalyst is lower than the concentration of the base (such as in low dose regions).

As a result of exposing the film to radiation, as described herein, the film may comprise a plurality of exposed regions, each comprising a plurality of low dose regions and a plurality of high dose regions, where each low dose region is included in the plurality of low dose regions, and each high dose region is included in the plurality of high dose regions.

The first base may be in sufficient excess of the first acid catalyst in the first low dose region such that a first portion of the first base neutralizes essentially all of the first acid catalyst in the first low dose region and a second portion of the first base remains in the first low dose region. For example, the boundary areas between the first exposed region and unexposed regions of the film may be a low dose region, such as an exposed boundary area as described above, where the PBG generates an amount of base in excess of acid catalyst generated by the PAG, such as is illustrated in FIG. 1.

The first acid catalyst may be in sufficient excess of the first base in the first high dose region such that a first portion of the first acid neutralizes essentially all of the first base in the first high dose region and a second portion of the first acid catalyst remains in the first high dose region. For example, areas of the first exposed region near the center of the exposed area, away from boundary areas may be high dose regions. The remaining portion of the first acid catalyst may interact with the polymer of the photoresist, such as by crosslinking or acid catalyzed bond cleavage.

Step 220 comprises exposing a second region of the film to radiation having a second exposure dose, resulting in the photosensitive acid generator generating a second acid catalyst in the exposed second region of the film and the photosensitive base generator generating a second base in the exposed second region of the film, where the exposed second region comprises a second low dose region and a second high dose region.

The first exposure dose and the second exposure dose may be equal or different. For example, the first exposure dose may be higher or lower than the first exposure dose depending on the formulation of the resist and the process steps applied before the second exposure.

The second base may be in sufficient excess of the second acid catalyst in the second low dose region such that a first portion of the second base neutralizes essentially all of the second acid catalyst in the second low dose region and a second portion of the second base remains in the second low dose region. For example, the boundary areas between the second exposed region and unexposed regions of the film may be a low dose region, such as an exposed boundary area as described above, where the PBG generates an amount of base in excess of acid catalyst generated by the PAG, such as is illustrated in FIG. 1.

The second acid catalyst may be in sufficient excess of the second base in the second high dose region such that a first portion of the second acid neutralizes essentially all of the second base in the second high dose region and a second portion of the second acid catalyst remains in the second high dose region. For example, areas of the second exposed region near the center of the exposed area, away from boundary areas may be high dose regions. The remaining portion of the second acid in the high dose region may interact with the polymer of the photoresist, such as by crosslinking or acid catalyzed bond cleavage.

Exposing the first region of the film to radiation in step 215 may comprise patternwise imaging the film through a first mask having a first image pattern. Exposing the second region of the first film to radiation in step 220 may comprise patternwise imaging the film through a second mask having a second image pattern. The first image pattern may be different or the same as the second image pattern. Resulting from patternwise imaging the film through the first mask and patternwise imaging the film through the second mask, at least one area of the film may remain unexposed to the radiation and a second region of the film may be exposed to the radiation. For example, the first and second image patterns may each have sections essentially transparent to the radiation, and each may have sections essentially opaque to the radiation. The transparent and opaque areas of each image pattern may or may not coincide, such that after the first and second exposures, there may be areas of the film which remain unexposed to radiation. Likewise, there may be regions of the film which have been exposed through the first image pattern, the second image pattern, or both.

The exposed regions of the film may comprise the first region exposed in steps 215 and the second region exposed in step 220. In some embodiments, one of the exposed first regions may be adjacent to or contiguous with one of the second exposed regions (e.g. the first exposed region and the second exposed region share an edge or boundary). Excess base in overlapping low dose areas (such as the boundary areas near the edges of these exposed regions) prevents the first and second exposed regions from overlapping their acid distribution with each other, resulting in improving the resolution of the double exposed patterns from the two exposures, by neutralizing acid catalyst in the low dose areas between the two exposed regions and preventing the acid catalyst from reacting with the polymer of the photoresist. The incorporation of base proliferator in the resist formulation may enhance the base concentration in the boundary areas through base proliferation, such as through baking at elevated temperature. Therefore, a baking step may be used between step 215 and 220 when the resist composition further comprises a base proliferator. For example, after the patternwise imaging of the film and before the developing of the film, the resist film may be baked at a temperature between about 80° C. and about 150° C.

Referring again to FIG. 2, the method may further comprise step 225, step 225 comprising removing soluble portions of the film, after exposing the second region, to leave a patterned layer remaining, where the patterned layer has a photoresist pattern. For example, removing soluble portions of the film may comprise developing the film in an aqueous base solution where the base-soluble exposed regions (or unexposed region for a negative tone resist) of the film may be removed from the film to form a patterned layer of the photoresist film. The developer may be organic or aqueous based, such as an aqueous base developer such as tetramethylammonium hydroxide (TMAH) aqueous solution, for example.

Figure 3A:
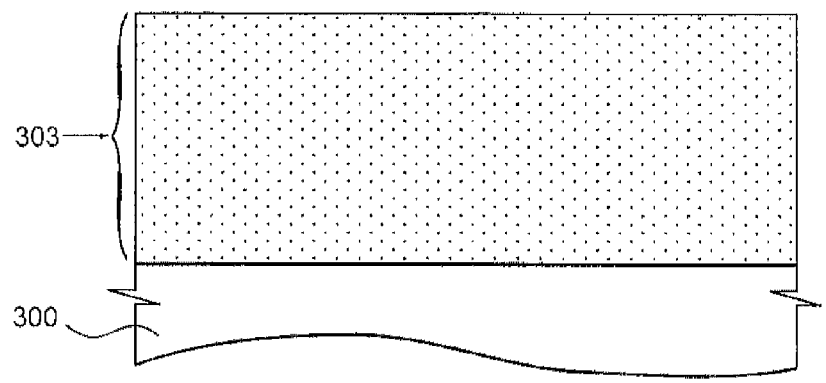
FIG. 3A an illustration of a film, comprising a photoresist, disposed on a substrate, in accordance with embodiments of the present invention.
Figure 3B:
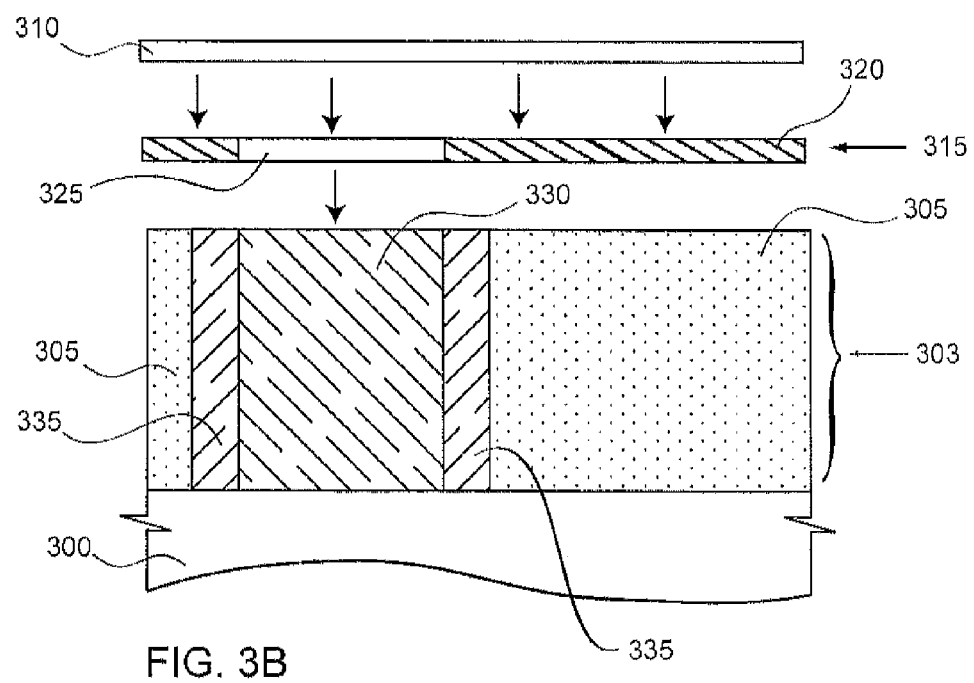
FIG. 3B is an illustration of the film of FIG. 3A being exposed to radiation, in accordance with embodiments of the present invention.

FIG. 3A is an illustration of a film 303, comprising a photoresist, disposed on a substrate 300, such as the photoresist films and substrates described above. FIG. 3B is an illustration of the film 303 of FIG. 3A being exposed to radiation as described for step 215 of FIG. 2, wherein a first radiation source 310 projects radiation through a first patterned mask 315 onto the film 303 disposed on the substrate 300. The first mask 315 may have a first image pattern comprising masked sections 320, which are essentially opaque to the radiation, and unmasked sections 325, which are essentially transparent to the radiation. Radiation passing through the unmasked sections 325 may be transmitted to the film 303 and simultaneously be received and absorbed in high dose region 330 and adjacent low dose regions 335 of the film 303. The dose of radiation in the high dose region 330 may be in a range of high radiation dosage, such as the high radiation dose range 115 illustrated in FIG. 1. The dose of radiation received by the low dose region 335 may be in a range of low radiation dosage, such as the low radiation dose range 110 of FIG. 1. The film may comprise unexposed areas 305 after the first exposure to radiation. The radiation may induce the production of an acid catalyst by the PAG in the exposed regions 330 and 335 of the film 303, where unexposed areas 305 of film 303 may not produce an acid catalyst. The radiation may induce the production of base by the PBG in the exposed regions 330 and 335, where in low dose regions 335 the produced base may be in higher concentration than acid and may neutralize essentially all the acid catalyst produced in the low dose regions 335. In the high dose regions 330, the acid catalyst produced by the PAG may be in higher concentration than the base produced by the PBG and thus the acid in the high dose region may neutralize essentially all of the base in the high dose region 330. Sufficient acid catalyst may remain in the high dose regions 330 after reaction with the base to interact with the polymer of the photoresist, such as by crosslinking or acid catalyzed bond cleavage.

Figure 3C:
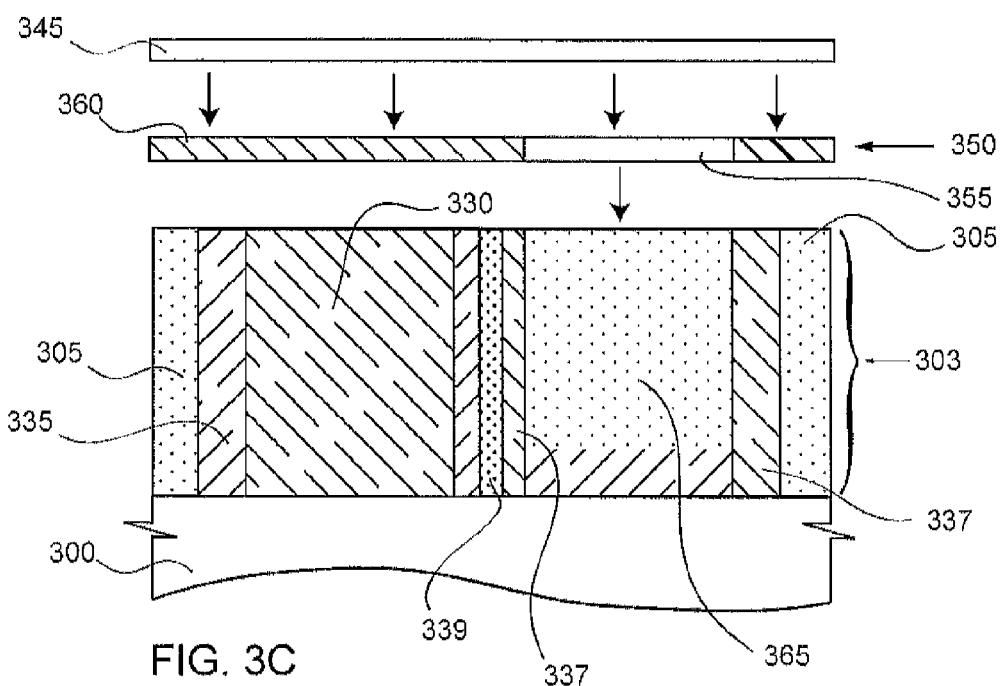
FIG. 3C is an illustration of the exposed film in FIG. 3B undergoing a second exposure, in accordance with embodiments of the present invention.

FIG. 3C is an illustration of the exposed film 303 in FIG. 3B undergoing a second exposure, wherein a second radiation source 345 projects radiation through a second patterned mask 350 onto the film 303 disposed on a substrate 300. As a result of the second exposure, the film may further comprise exposed regions 337 and 365, where 365 may be a high dose region and adjacent region 337 may be a low dose region, such as is described above. At least one area 305 of the film 303 may remain unexposed after the first and second exposures. At least one low dose region 335 and at least one low dose region 337 may overlap to form an overlap area 339 between two adjacent exposed regions. The PAG may produce an acid catalyst in the high dose region 335 and the low dose region 337, where the acid produced in the low dose region 337 by the PAG may be essentially neutralized by base produced in the low dose region 337 by the PBG as a result of the second exposure to radiation. Base produced by the PBG in the high dose region 365 may be essentially neutralized by a portion of the acid produced in sufficient excess in the high dose region 365 by the PAG such that a portion of the acid remains and may react with the polymer of the photoresist. The excess base produced in the overlap area 339 neutralizes acid catalyst in the overlap area 339 thus preventing interaction of the acid catalyst with the polymer of the photoresist in the overlap area 339.

The photoresist may comprise a negative tone photoresist, where the polymer may be configured such that, as a result of the first and second exposures, unexposed areas 305, low dose regions 335 and 337, and overlap region 339 may be removed in a developing step comprising developing the film 303 in a developer (such as aqueous base or solvent), where the unexposed areas 305, low dose regions 335 and 337, and overlap region 339 of the film 303 are base-soluble regions. Such a polymer configuration may comprise base-soluble groups in the polymer structure, where acid catalyst reaction with the polymer in the high dose regions 330 and 365 may render the polymer insoluble in aqueous base developer. For example, the polymer in the high dose regions 330 and 365 may undergo crosslinking and become insoluble in developer.

The photoresist may comprise a positive tone photoresists, where the polymer may be configured such that, as a result of the first and second exposures, exposed regions of the film 303 may be removed in a developing step comprising developing the film in a developer (such as aqueous base or solvent), where the exposed regions of the film are base-soluble, such as where acid catalyst reacts with the polymer (such as high dose regions 365 and 330). Such a polymer configuration may comprise a polymer structure having acid labile groups which may be cleaved by reaction with the acid catalyst, thus rendering the polymer soluble in developer.

After the patternwise imaging of the film and before developing, the film may be baked at a temperature between about 80° C. and about 150° C.

Figure 3D:
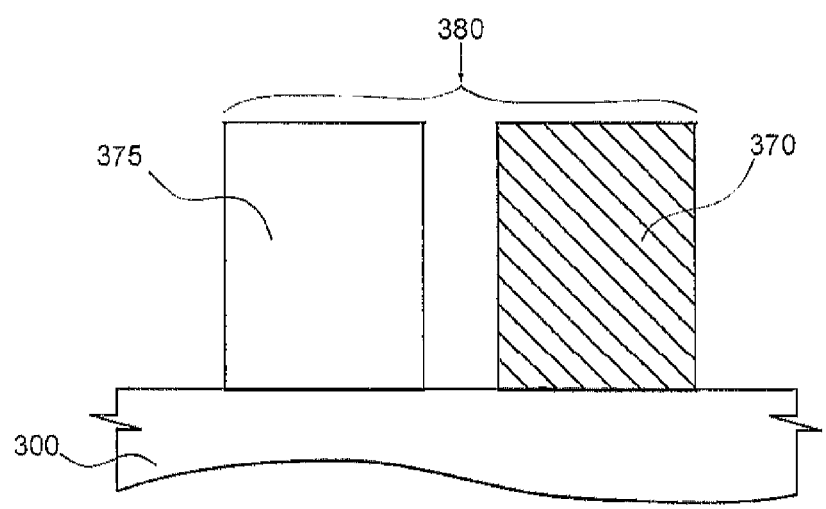
FIG. 3D is an illustration of the doubly exposed film 303 in FIG. 3C after the film has been developed in a developer, in accordance with embodiments of the present invention.

FIG. 3D is an illustration of the doubly exposed film 303 in FIG. 3C after the film has been developed in a developer (such as aqueous base) and, as a result of the developing, unexposed areas 305 and low dose regions 335, 337 and 339 of the film 303 have been removed and a first patterned layer 380 of the film 303 is formed. The first patterned layer may have a photoresist pattern comprising features 370 and 375 remaining on the surface of the substrate 300, where features 370 and 375 are formed from exposed high dose regions 365 and 330, respectively. In the example of FIG. 3D, the polymer composition was such that the acid catalyst produced in the exposed areas 365 and 330 of FIG. 3C interacted with the polymer in such a way as to render the polymer in those areas insoluble in developer such that the unexposed areas 305 and low dose regions 335, 337 and 339 in FIG. 3C were removed to leave the first patterned layer 380 remaining.

Figure 3E:
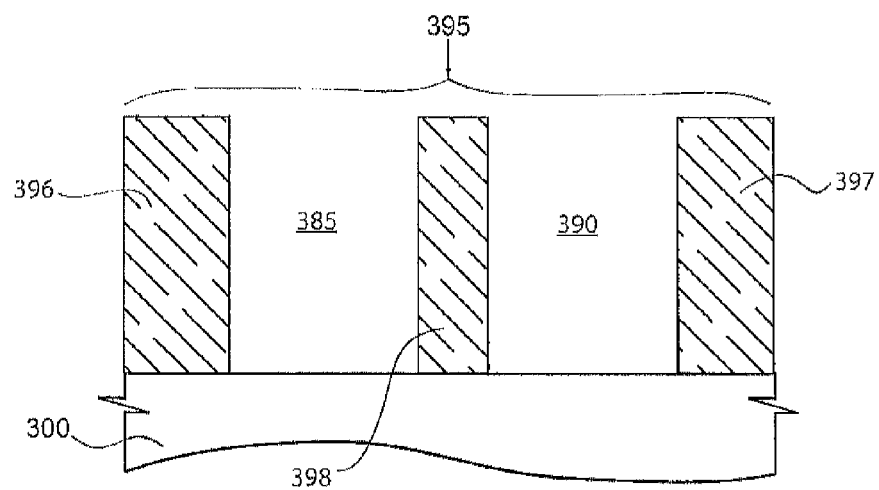
FIG. 3E is an illustration of the doubly exposed film 303 in FIG. 3C after the film has been developed in a developer, in accordance with embodiments of the present invention.

FIG. 3E is an illustration of the doubly exposed film 303 in FIG. 3C after the film has been developed in a developer (such as aqueous base) and, as a result of the developing, exposed high dose regions 330 and 365 of the film 303 have been removed and a second patterned layer 395 of the film 303 is formed. The second patterned layer 395 may have a photoresist pattern comprising features 396, 398, and 397 remaining on the surface of the substrate 300, as well as open gaps 385 and 390 where gaps 385 and 390 are open areas remaining after the removal of exposed high dose regions 330 and 365, respectively. In the example of FIG. 3E, the polymer composition was such that the acid catalyst produced in the exposed high dose regions 365 and 330 of FIG. 3C interacted with the polymer in such a way as to render the polymer in those regions soluble in developer such that the exposed high dose regions 365 and 330 were removed, leaving unexposed areas 305 and low dose regions 335, 337 and 339 to leave the patterned layer 395 remaining.

The photoresist pattern of the patterned layer may be transferred to the substrate. If the substrate comprises an antireflective coating (ARC) and/or planarizing underlayer onto which the photoresist film has been formed, the ARC and/or planarizing underlayer may be removed at the gaps in the patterned photoresist layer to expose portions of the substrate. For example, the antireflective coating and/or planarizing underlayer may be removed by etching. Once the desired portions of the substrate are exposed, the photoresist pattern in the patterned layer (e.g. the pattern of gaps within the exposed film) may be transferred to portions of the substrate. Transferring the pattern may comprise, for example, etching, such as reactive ion etching (RIE), depositing (such as vapor deposition or electroplating) a material (such as a dielectric, a metal, a ceramic or a semiconductor) onto the substrate in a gap in the exposed photoresist film, by implanting dopants into the substrate material in a gap in the exposed photresist film, or by a combination of one or more of these methods.

The photoresists and films thereof described herein may be patternwise imaged using radiation such as ultraviolet (UV) such as wavelengths of approximately 436 nanometers (nm) and 365 nm, deep-ultraviolet (DUV) such as wavelengths of approximately 257 nm, 248 nm, 193 nm, and 157 nm, extreme-ultraviolet (EUV) such as a wavelength of approximately 4 nm to approximately 70 nm such as approximately 13 nm, x-ray, combinations of these, and the like. Various wavelengths of radiation may be used such as 313 nm, 334 nm, 405 nm, and 126 nm etc., where the sources may be mainly from specific mercury emission lines or specific lasers. For high performance lithography, single wavelength and/or narrow band radiation sources may be used. For less stringent conditions, a broad band multiple wavelength source may be used. The photoresist compositions of the present invention may be patternwise imaged using particle beams such as electron beam, ion beam, combinations of these, and the like. The appropriate radiation or particle beam type(s) may depend on the components of the overall photoresist composition (e.g., the selection of the PBG, polymer, photosensitive acid generator (PAG), base proliferator, base (or quencher), surfactant, solvent, etc.).

Example 1

A terpolymer comprising 45 mole % MAdMA, 15 mole % STAR and 40 mole % NLM was dissolved in PGMEA with 4 wt % TPSN (triphenyl sulfonium nonaflate), 0.85 weight % (wt %) (i.e. 20 mole %) of DNC and 0.93 wt % (i.e. 20 mole %) of DFC (all wt. % are relative to total polymer weight) to make a solution having 7 wt % of solid content. The resulting solution was filtered through a 0.2 micron (μm) filter. The resist was spin coated onto a 12 inch silicon wafer which had an approximately 42 nanometer (nm) thickness coating of Rohm & Haas bottom anti-reflective coating (BARC) named AR40A. The resist was post-applying baked (PAB) at about 110° C. for about 60 seconds and exposed to 193 nm wavelength light on an ASML stepper (1.1 NA, 0.75 outer and 0.55 inner σ annular illumination). The wafer was then post-exposure baked (PEB) at about 120° C. for about 60 seconds. The film was developed using a single puddle develop process for about 30 seconds with 0.263 N TMAH (tetramethylammonium hydroxide) developer. At the dose of 14.8 millijoules/centimeter$^2$ (mj/cm$^2$), the 85 nm lines on a 180 nm pitch were resolved.

Example 2

A terpolymer comprising 45 mole % MAdMA, 15 mole % STAR and 40 mole % NLM was dissolved in PGMEA with 4 wt % TPSN (triphenyl sulfonium nonaflate), 0.40 wt % (i.e. 20 mole %) of NBC-101 and 0.93 wt % (20 mole %) of DFC (all wt. % are relative to total polymer weight) to make a solution having 7 wt % of solid content. The resulting solution was filtered through a 0.2 μm filter. The resist was spin coated onto a 12 inch silicon wafer which had an approximately 42 nm thickness coating of Rohm & Haas bottom anti-reflective coating (BARC) named AR40A. The resist was post-applying baked (PAB) at about 110° C. for about 60 seconds and exposed to 193 nm wavelength light on an ASML stepper (1.1 NA, 0.75 outer and 0.55 inner σ annular illumination). The wafer was then post-exposure baked (PEB) at about 120° C. for about 60 seconds. The film was then developed using a single puddle develop process for about 30 seconds with 0.263 N TMAH developer. At the dose of 14.8 mj/cm2, the 85 nm lines on a 180 nm pitch were resolved.

Example 3

A terpolymer comprising 45 mole % MAdMA, 15 mole % STAR and 40 mole % NLM was dissolved in PGMEA with 4 wt % TPSN (triphenyl sulfonium nonaflate), 0.14 wt % (i.e. 5 mole %) of ANC and 0.93 wt % (i.e. 20 mole %) of DFC (all wt. % are relative to total polymer weight) to make a solution with about 7 wt % of solid content. The resulting solution was filtered through a 0.2 μm filter. The resist was spin coated onto a 12 inch silicon wafer which had an approximate 42 nm thickness coating of Rohm & Haas bottom anti-reflective coating (BARC) named AR40A. The resist was post-applying baked (PAB) at about 110° C. for about 60 seconds and exposed to 193 nm wavelength light on an ASML stepper (1.1 NA, 0.75 outer and 0.55 inner σ annular illumination). The wafer was then post-exposure baked (PEB) at about 120° C. for about 60 seconds. The film was developed using a single puddle develop process for about 30 seconds with 0.263 N TMAH developer. At the dose of 14.8 mj/cm2, 85 nm lines on a 180 nm pitch were resolved.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A photoresist composition, comprising:
   a polymer having a structure comprising at least one acid labile group;
   a photosensitive acid generator capable of generating a first amount of acid upon exposure to a first dose of radiation, said photosensitive acid generator capable of generating a second amount of acid upon exposure to a second dose of radiation, said second amount of acid greater than said first amount of acid, said second dose of radiation greater than said first dose of radiation, wherein the photosensitive acid generator comprises (trifluoro-methylsulfonyloxy)-bicyclo[2.2.1]hept-5-ene-2,3-dicarboximide (MDT), N-hydroxy-naphthalimide dodecane sulfonate (DDSN), or a combination thereof; and
   a photosensitive base generator capable of generating a first amount of base upon exposure to said first dose of radiation, said photosensitive base generator capable of generating a second amount of base upon exposure to said second dose of radiation, said first amount of base greater than said first amount of acid, said second amount of base less than said second amount of acid,
   wherein said photosensitive base generator is selected from the group consisting of quaternary ammonium salts, and,
   wherein the quaternary ammonium salts have the following structure

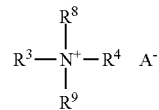

wherein at least two groups of groups $R^3$, $R^4$, $R^8$, and $R^9$ are each independently an aryl or substituted aryl group, wherein at least one group of groups $R^3$, $R^4$, $R^8$, and $R^9$ is independently an alkyl, substituted alkyl, or substituted aryl group, and wherein $A^-$ is an anion.

2. The photoresist composition of claim 1, where at least three groups of groups $R^3$, $R^4$, $R^8$, and $R^9$ are each independently an aryl or substituted aryl group.

3. The photoresist composition of claim 1, wherein a first group and a second group of the at least two groups is a first aryl group and a second aryl group, respectively, and wherein the first aryl group and the second aryl group are either a same aryl group or a different aryl group.

4. The photoresist composition of claim 1, wherein a first group and a second group of the at least two groups is a first substituted aryl group and a second substituted aryl group, respectively, and wherein the first substituted aryl group and the second substituted aryl group are either a same substituted aryl group or a different substituted aryl group.

5. The photoresist composition of claim 1, wherein a first group and a second group of the at least two groups is an aryl group and a substituted aryl group, respectively.

6. The photoresist composition of claim 1, where each group of groups $R^3$, $R^4$, $R^8$, and $R^9$ is a substituted aryl group, and wherein at least two groups of groups $R^3$, $R^4$, $R^8$, and $R^9$ are either a same substituted aryl group or a different substituted aryl group.

7. The photoresist composition of claim 1, wherein a first group of at least one group is a substituted aryl group.

8. The photoresist composition of claim 1, wherein a first group of the at least two groups is a substituted aryl group, and wherein a first group of the at least one group is an alkyl group.

9. The photoresist composition of claim 1, wherein a first group of the at least two groups is a substituted aryl group, and wherein a first group of the at least one group is a substituted alkyl group.

10. The photoresist composition of claim 2, wherein a first group, a second group, and a third group of the at least three groups is a first aryl group, a second aryl group, and a third aryl group, respectively, and wherein at least two groups of the first, second and third aryl groups are either a same aryl group or a different aryl group.

11. The photoresist composition of claim 2, wherein a first group, a second group, and a third group of the at least three groups is a first aryl group, a second aryl group, and a substituted aryl group, respectively, and wherein the first aryl group and the second aryl group are either a same aryl group or a different aryl group.

12. The photoresist composition of claim 2, wherein a first group, a second group, and a third group of the at least three groups is an aryl group, a first substituted aryl group, and a second substituted aryl group, respectively, and wherein the first substituted aryl group and the second substituted aryl group are either a same substituted aryl group or a different substituted aryl group.

13. The photoresist composition of claim 2, wherein a first group, a second group, and a third group of the at least three groups is a first substituted aryl group, a second substituted aryl group, and a third substituted aryl group, respectively, and wherein at least two groups of the first, second and third substituted aryl groups are either a same substituted aryl group or a different substituted aryl group.

14. The photoresist composition of claim 2, wherein a first group of the at least three groups is a substituted aryl group, and wherein a first group of the at least one group is an alkyl group.

15. The photoresist composition of claim 2, wherein a first group of the at least three groups is a substituted aryl group, and wherein a first group of the at least one group is a substituted alkyl group.

* * * * *